(12) United States Patent
Hori et al.

(10) Patent No.: US 8,836,080 B2
(45) Date of Patent: Sep. 16, 2014

(54) POWER SEMICONDUCTOR MODULE

(71) Applicant: Fuji Electric Co., Ltd., Kawasaki (JP)

(72) Inventors: Motohito Hori, Matsumoto (JP); Yoshinari Ikeda, Matsumoto (JP); Takafumi Yamada, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/765,853

(22) Filed: Feb. 13, 2013

(65) Prior Publication Data

US 2013/0277800 A1 Oct. 24, 2013

(30) Foreign Application Priority Data

Apr. 19, 2012 (JP) ................. 2012-095791

(51) Int. Cl.
*H01L 23/538* (2006.01)
*H01L 49/02* (2006.01)

(52) U.S. Cl.
CPC .................. *H01L 28/40* (2013.01)
USPC ..... 257/532; 257/676; 257/784; 257/E23.169

(58) Field of Classification Search
USPC ........................................ 257/532
See application file for complete search history.

(56) References Cited

U.S. PATENT DOCUMENTS

| 6,650,559 | B1 | 11/2003 | Okamoto et al. | |
| 2007/0158859 | A1* | 7/2007 | Hierholzer | 257/784 |
| 2013/0146339 | A1* | 6/2013 | Yano et al. | 174/255 |

FOREIGN PATENT DOCUMENTS

| JP | 2002-204580 A | 7/2002 |
| JP | 2009-064852 A | 3/2009 |
| JP | 2011-147212 A | 7/2011 |

* cited by examiner

*Primary Examiner* — Mamadou Diallo
(74) *Attorney, Agent, or Firm* — Rossi, Kimms & McDowell LLP

(57) ABSTRACT

Embodiments of the invention provide a power semiconductor module wherein it is possible to reduce switching noise generated in a switching element, and at the same time, to reduce thermal resistance between a power semiconductor chip and an insulating substrate. In some embodiments, by a capacitor being installed between a printed substrate and an insulating substrate so as to be adjacent to a power semiconductor chip which is a switching element, it is possible to reduce switching noise generated in the switching element, and furthermore, it is possible to reduce thermal resistance between the power semiconductor chip and insulating substrate.

8 Claims, 8 Drawing Sheets

POWER SEMICONDUCTOR MODULE

BACKGROUND OF THE INVENTION

1. Technical Field

Embodiments of the invention relate to power semiconductor modules and, in particular, to power semiconductor modules wherein it is possible to reduce switching noise.

2. Related Art

FIGS. 7A and 7B are configuration diagrams of a heretofore known power semiconductor module 201, wherein FIG. 7A is a main portion plan view, and FIG. 7B is a main portion sectional view taken along the line A-A of FIG. 7A.

The power semiconductor module 201, being a power semiconductor module of a type wherein main electrodes of power semiconductor chips 205 are electrically connected by a plurality of post electrodes 211, is described in Japanese Patent Application Publication No. JP-A-2009-64852.

The power semiconductor module 201 of FIGS. 7A and 7B has an integrated structure in which an insulating substrate 202 and an implanted printed substrate 203 (hereafter the printed substrate) opposed to the insulating substrate 202 are sealed with an underfill material, a resin material 204, or the like, wherein a plurality of the power semiconductor chips 205 are mounted on the insulating substrate 202.

Furthermore, the power semiconductor module 201, by being packaged using an unshown resin case, functions as, for example, a general-purpose IGBT (insulated gate bipolar transistor) module. The insulating substrate 202 includes an insulating plate 206, a metal foil 207 formed on the bottom of the insulating plate 206 by a DCB (direct copper bonding) method, and a plurality of metal foils 208 formed on the top of the insulating plate 206 likewise by the DCB method.

Furthermore, the power semiconductor chip 205 is joined to the top of each metal foil 208 across a lead-free solder layer 209 of a tin (Sn)-silver (Ag) series. Also, a plurality of through holes 210 are provided in the printed substrate 203, an unshown thin-walled cylindrical plated layer is provided in each through hole 210, and the cylindrical post electrodes 211 are implanted one each in the through holes 210 across the respective cylindrical plated layers.

Also, the power semiconductor chips 205 are joined one each to the post electrodes 211 across respective solder layers 212. Also, the printed substrate 203 has a multilayer structure in which, for example, a resin layer 213 is disposed in the center portion, and a metal foil 214 is selectively formed by patterning on each of the top and bottom of the resin layer 213.

FIG. 8 is a circuit configuration diagram of a power conversion device using a power semiconductor module. The power conversion device is described in Japanese Patent Application Publication No. JP-A-2002-204580.

The power conversion device is divided broadly into three circuit sections as a circuit configuration, a noise filter section 215, a main circuit section 216, and a control circuit section 217. The noise filter section 215 is formed of a three-phase AC power source 218, reactors 219 connected in series one to each of three power lines via input terminals R, S, and T, ground capacitors 220, and interphase capacitors 221.

The noise filter section 215 has the function of filtering switching noise generated along with a switching operation of power semiconductor chips configuring a power converter such as an inverter. The main circuit section 216 is formed of a rectifier circuit 224 connected to the noise filter section 215, a smoothing capacitor 225 connected to a pair of output terminals of the rectifier circuit 224, and an inverter circuit 223 connected to the smoothing capacitor 225.

The inverter circuit 223 (configured of a power semiconductor module) has, for example, a switching element formed of an IGBT (insulated gate bipolar transistor) and a power semiconductor element 226 configured of a free wheeling diode, and each element is on/off controlled. Electric equipment, herein, a three-phase induction motor 227, is connected as a load of the inverter circuit 223. The control circuit section 217 is formed of a DC-DC converter 228 and a control circuit 229 including a CPU, ROM, RAM, and the like, which carry out various kinds of signal processing and control. The DC-DC converter 228 is connected to output terminals of the rectifier circuit 224, and the three-phase AC power source 218 is input into the DC-DC converter 228. Power converted to a predetermined value by the DC-DC converter 228 is supplied to the control circuit 229. The control circuit 229 is connected to a gate terminal of the switching element (power semiconductor element 226) of the inverter circuit 223. The switching element is on/off controlled based on a control signal from the control circuit 229, output voltage pulse-wave modulated (PWMed) thereby is output from output terminals U, V, and W, and the three-phase induction motor 227 rotates.

Also, it is described in Japanese Patent Application Publication No. JP-A-2011-147212 that, in only an upper arm wherein two semiconductor elements are connected in parallel, as a current imbalance occurs due to the semiconductor elements differing in inductance depending on a wire length, a configuration is adopted such that it is possible, even when a current imbalance occurs due to a difference in wire length, to suppress an imbalance in turn-off loss between the semiconductor elements, and thus reduce the loss, by making the capacitance of a snubber capacitor with a shorter wire length higher than the capacitance of a snubber capacitor (Cs2) with a longer wire length.

However, with the heretofore known power semiconductor module 201, there have been the following problems. The first problem is a problem of switching noise. A switching operation of a switching element such as an IGBT configuring the power semiconductor module 201 is carried out based on a pulse-wave modulated (PWMed) drive signal with a carrier frequency of in the order of several kHz to a dozen kHz.

Switching noise with a frequency component of tens or more of kHz is generated in the switching element (IGBT or the like) by the switching operation, adversely affecting an external device. In order to suppress the adverse effect, the noise filter 215 is installed in the power conversion device, as shown in FIG. 8. However, as the noise filter 215 is installed outside the package of the power semiconductor module 201 so as to be distanced from the switching element (IGBT or the like) configuring the power semiconductor module 201, it is difficult to sufficiently suppress switching noise.

The second problem is a thermal problem. The power semiconductor chips 205 are being reduced in size and thickness year by year in order to reduce the cost of the power semiconductor module 201, because of which a rise in temperature of the power semiconductor chips 205 due to an increase in current density has become a problem.

The package size of the power semiconductor module 201 is also being reduced in size along with the reduction in size of the power semiconductor chips 205, and thermal resistance Rjc from the power semiconductor chips 205 to a cooling body increases. Also, a rise in temperature of the power semiconductor chips 205 from the effect of a thermal interference between adjacent power semiconductor chips 205, or the like, remains as a problem.

Also, in Japanese Patent Application Publication No. JP-A-2011-147212, it is described that it is possible to suppress an imbalance in turn-off loss between the semiconductor elements, and thus reduce the loss, even when a current imbalance occurs due to the difference in wire length, but no measure to suppress switching noise generated in the switching element is described. Thus, as described above, there are several shortcomings in the related art.

SUMMARY OF THE INVENTION

Embodiments of the invention address these and other shortcomings. Some embodiments of the invention provide a power semiconductor module wherein it is possible to reduce switching noise generated in a switching element, and at the same time, reduce thermal resistance between a power semiconductor chip and an insulating substrate.

In order to achieve the object, according to a first aspect, a power semiconductor module, including an upper substrate and a lower substrate on the top of which a power semiconductor chip is mounted, is configured so that the power semiconductor chip and upper substrate are connected by conductors, and a capacitor connected in parallel circuit-wise to a power semiconductor corresponding to the power semiconductor chip connects the upper substrate and lower substrate.

Also, according to a second aspect, in the first aspect, the capacitor is formed of a plurality of capacitors connected in parallel.

Also, according to a third aspect, in the first or second aspect, the distance between the power semiconductor chip and capacitor is 0.3 mm or more and 10 mm or less.

Also, according to a fourth aspect, in the first aspect, the thermal resistance of a path from the top of the power semiconductor chip via the conductors, upper substrate, and capacitor to the bottom of the lower substrate is 0.3° C./W or less.

Also, according to a fifth aspect, in the first aspect, the capacitance of the capacitor is from 10 pF to 1 µF.

Also, according to a sixth aspect, in the second aspect, the combined capacitance of the plurality of capacitors is from 10 pF to 1 µF.

Also, according to a seventh aspect, in the first aspect, the upper substrate is a printed substrate, the lower substrate is a conductively patterned insulating substrate, and the conductors are post electrodes, wherein externally led-out terminals are connected to conductive patterns of the conductively patterned insulating substrate, a rear surface side conductive film of the conductively patterned insulating substrate and leading end portions of the externally led-out terminals are exposed, and the whole is sealed with a resin.

Also, according to an eighth aspect, in the first aspect, the capacitor is a ceramic capacitor chip.

According to the invention, by a capacitor being installed between the printed substrate and insulating substrate so as to be adjacent to a switching element, it is possible to reduce switching noise generated in the switching element, and furthermore, it is possible to reduce thermal resistance between the power semiconductor chip and insulating substrate. As a result of this, it is possible to provide a power semiconductor module reduced in size, noise, thermal resistance, and cost.

BRIEF DESCRIPTION OF THE DRAWINGS

FIGS. 1A and 1B are configuration diagrams of a power semiconductor module 100 of a first working example of embodiments of the invention, wherein FIG. 1A is a main portion plan view, and FIG. 1B is a main portion side view seen in the direction of an arrow K of FIG. 1A;

FIGS. 7A and 7B are configuration diagrams of a heretofore known power semiconductor module 201, wherein FIG. 7A is a main portion plan view, and FIG. 7B is a main portion sectional view taken along the line A-A of FIG. 7A.

DETAILED DESCRIPTION

Embodiments are described below using the following working examples.

Working Example 1

Figure 1:
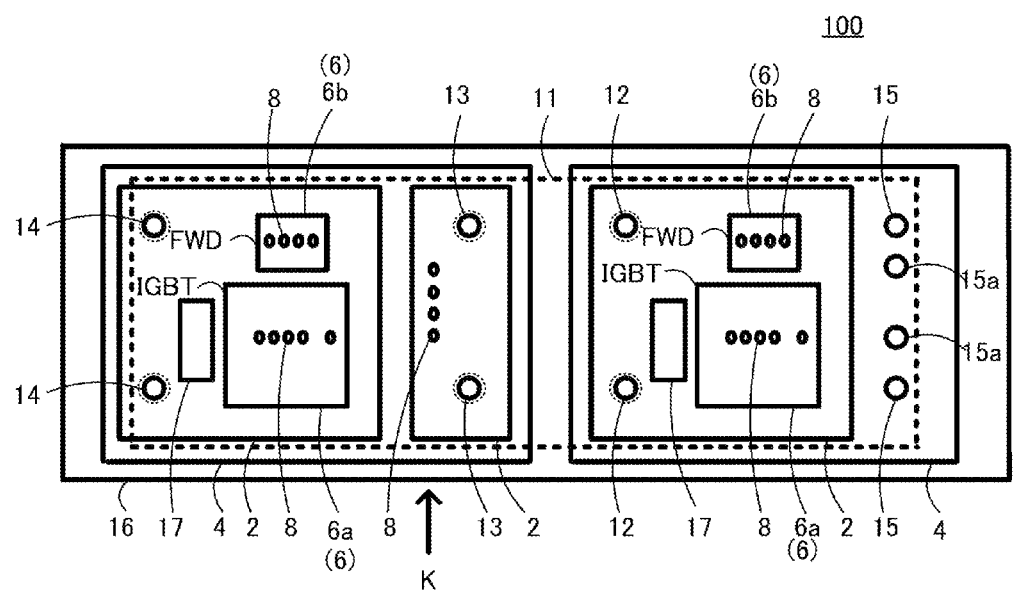
Figure 1:
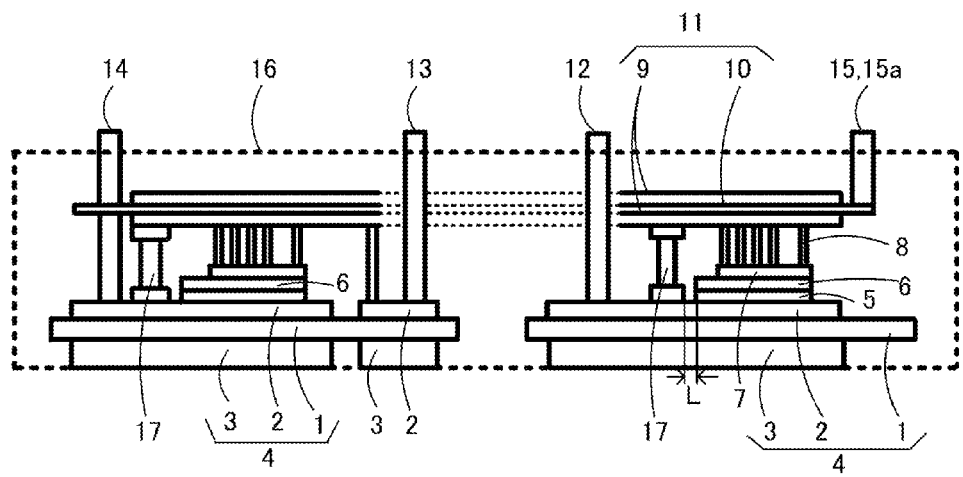

FIGS. 1A and 1B are configuration diagrams of a power semiconductor module 100 of a first working example of the invention, wherein FIG. 1A is a main portion plan view, and FIG. 1B is a main portion side view seen in the direction of an arrow K of FIG. 1A. FIG. 1A is a layout diagram of each component in a resin 16. The power semiconductor module 100 is of a type wherein main electrodes of power semiconductor chips 6 and an insulating base material 10 (printed substrate) are electrically connected by a plurality of post electrodes 8. The power semiconductor module 100, like one described as a related art, carries out a current switching, or the like, for use in a power control, or the like, using a power semiconductor.

The power semiconductor module 100 is a 2-in-1 module configured of two combinations in each of which the power semiconductor chips 6 are joined one by each solder 5 to the top of an insulating substrate 4 formed of an insulating layer 1, such as a ceramic substrate, and copper plates 2 and 3. The power semiconductor chips 6 include an IGBT chip 6a and an FWD chip 6b in each combination. Furthermore, a printed substrate 11, having the post electrodes 8, formed of copper wires 9 and the insulating base material 10 is mounted across a solder 7 on the top of each power semiconductor chip 6, and the power semiconductor chips 6 are electrically connected by the printed substrate 11. Collector side connection terminals 12 are terminals which supply current to the rear surfaces of the power semiconductor chips 6, and emitter side connection terminals 13 are terminals which cause current from the front surfaces of the power semiconductor chips 6 to flow to the exterior. Also, output terminals 14 are terminals, located between a collector side wire and an emitter side wire, which cause output current to flow, and gate connection terminals 15 and emitter signal terminals 15a are terminals which control a turning on/off of the power semiconductor chips 6. The whole is sealed with the resin 16.

Figure 7:
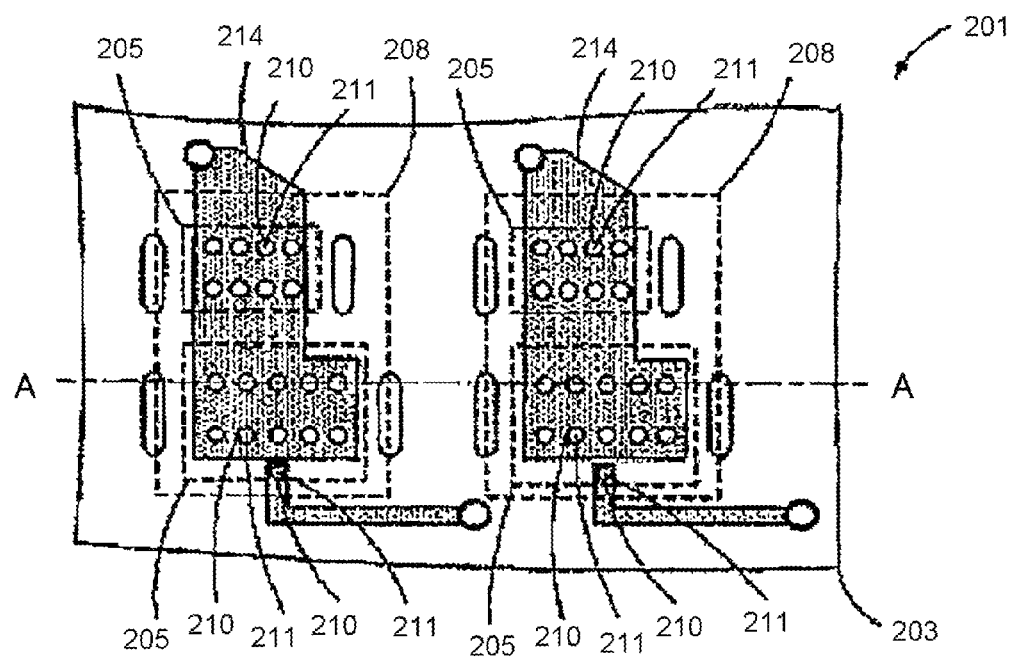
Figure 7:
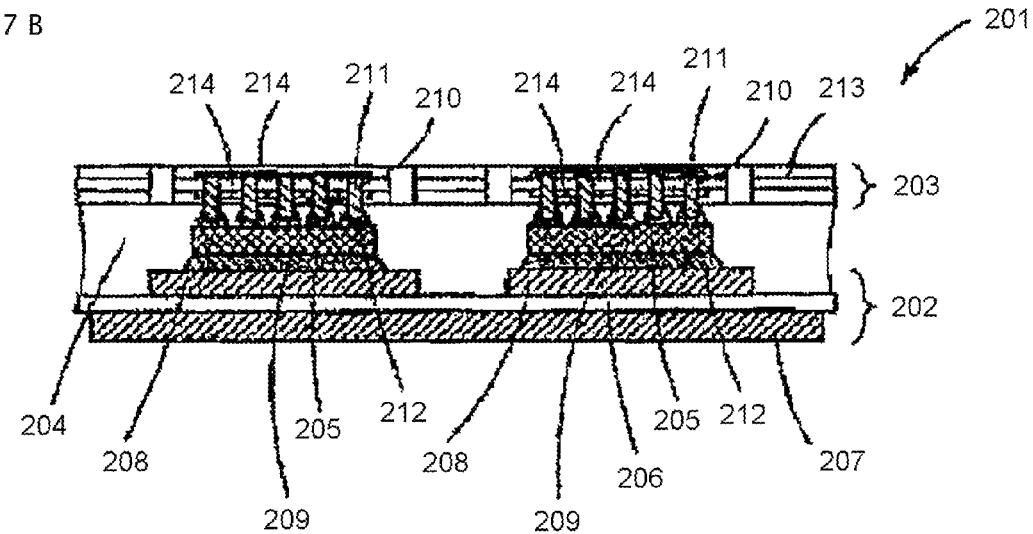
Figure 8:
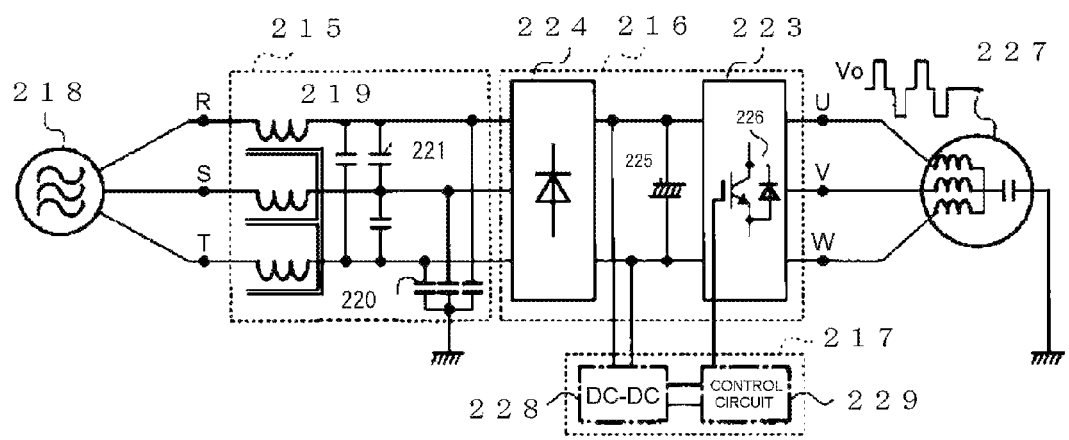
FIG. 8 is a circuit configuration diagram of a power conversion device using a power semiconductor module.

A difference from a heretofore known power semiconductor module shown in FIG. 7 is in that a capacitor 17 in each combination is installed in a portion inside the resin 16 close to the power semiconductor chip 6. One end of each capacitor 17 is connected to the copper wire 9 of the printed substrate 11 with the post electrodes, and the other end is connected to the copper plate 2 of the insulating substrate 4. The power semiconductor chip 6 and capacitor 17 are disposed in parallel circuit-wise. The terminals of each capacitor 17 are firmly fixed to the copper wire 9 and copper plate 2 by a bond such as a solder. Also, a distance L between the capacitor 17 and power semiconductor 6 is set at a range of 0.3 mm to 10 mm. When less than 0.3 mm is set, the gap between the power semiconductor chip 6 and capacitor 17 is too narrow, and there is concern that the resin 16 is not cast into the gap, causing an insulation failure. Also, when over 10 mm is set, the area of the insulating substrate 4 becomes too large, and the external dimensions of the power semiconductor module 100 become larger, leading to a cost increase. When the distance L is in a range of 0.3 mm to 5 mm, there is an advantage in that a power semiconductor module can be configured to a particularly small size.

By disposing the capacitor 17 close to the power semiconductor chip 6 in this way, it is possible to reduce switching noise by in the order of 10% to 30%. Switching noise generated in an IGBT is evaluated under switching noise evaluation conditions with, for example, an IGBT switching frequency of 5 kHz, a collector voltage of 300V, a collector current of 100 A, a capacitor 17 capacitance of 1 nF, and a distance L of 0.3 mm. The capacitor 17 used at this time is a ceramic capacitor 18 shown in FIG. 3.

Also, by installing the capacitor 17, it is possible to reduce thermal resistance Rjc from the front surface of the power semiconductor chip 6 to the rear surface of the insulating substrate 4.

Next, a description is given of an internal configuration of the ceramic capacitor 18 that can be used as the capacitor 17.

Figure 2:
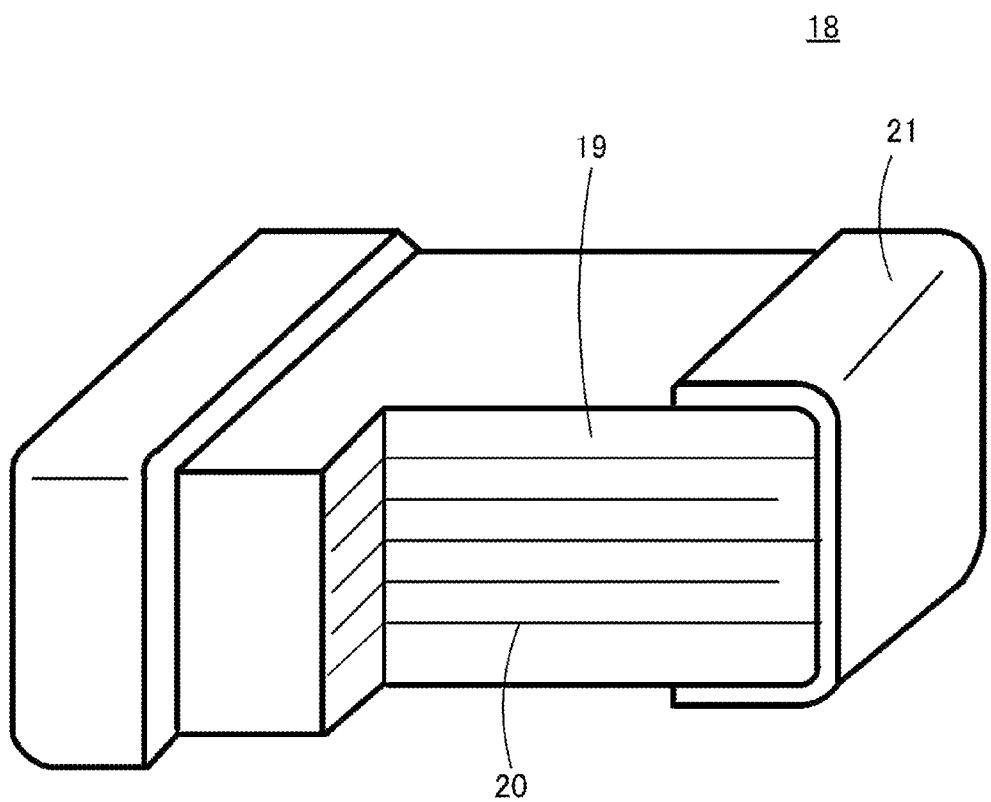
FIG. 2 is a typical internal configuration diagram of a ceramic capacitor 18.

FIG. 2 is a typical internal configuration diagram of the ceramic capacitor 18. The ceramic capacitor 18 is configured of an internal electrode 20 and an external electrode 21, using titanium oxide, alumina, or barium titanate as a dielectric body 19. Although it is common that the capacitance is 0.5 pF to 0.1 g, some have a higher capacitance (for example, 680 µF) with a physical parallel connection. By regulating the thermal conductivity of the dielectric body 19, it is possible to improve the thermal conduction of the ceramic capacitor 18 itself.

Capacitance of the capacitor 17 necessary to reduce switching noise by 10% or more is 10 pF to 1 µF. When the capacitance is less than 10 pF, a switching noise reduction effect becomes too low, and when the capacitance is over 1 µF, the dimensions of the capacitor 17 become too large, and the external dimensions of the power semiconductor module 100 become larger, leading to an increase in cost too. When the capacitance of the capacitor 17 is in the order of 10 pF to 300 pF, it is possible to obtain a practical noise reduction effect, and it is possible to achieve sufficiently small capacitor dimensions. When the capacitance of the capacitor 17 is in a range of 300 pF to 1 nF, it is possible to obtain a further noise reduction effect, and it is also possible to reduce the capacitor dimensions. Also, as the capacitor 17, the ceramic capacitor 18 is preferable because it is possible therewith to obtain a high capacitance with small dimensions.

Figure 3:
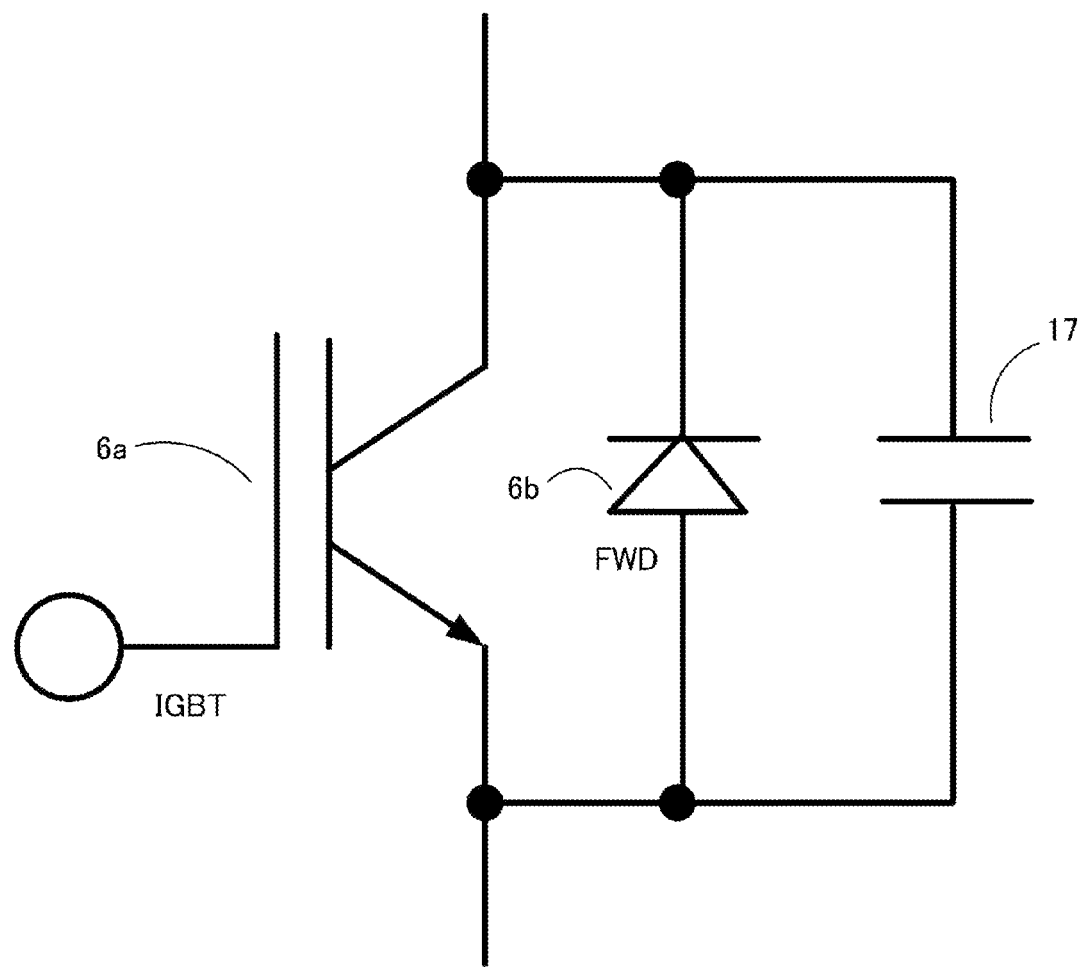
FIG. 3 is a main portion circuit configuration diagram of the power semiconductor module 100.

FIG. 3 is a main portion circuit configuration diagram of an embodiment of the power semiconductor module 100. Herein, the power semiconductor chip 6 which is one switching element 6a (for example, an IGBT (insulated gate bipolar transistor)) and the power semiconductor chip 6 which is one FWD (free wheeling diode) 6b are connected, and furthermore, the capacitor 17 is connected in parallel. The capacitor 17 is provided for each arm, thus forming an individual snubber circuit between the arms, which has the function of filtering switching noise.

Figure 4:
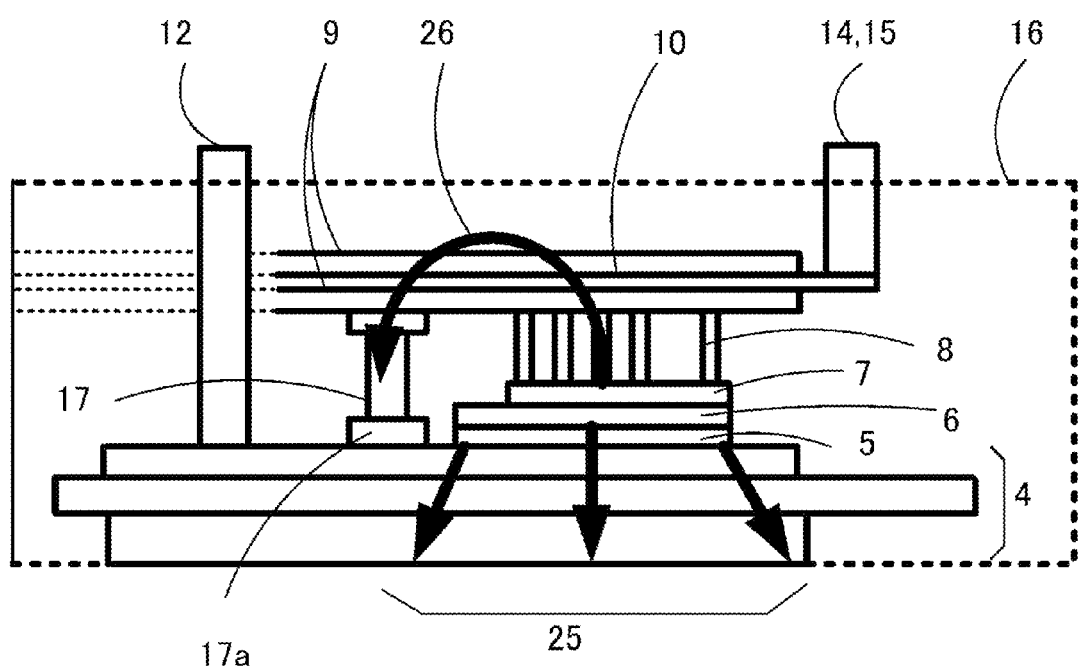
FIG. 4 is a diagram illustrating heat dissipation.

Next, a description will be given of heat dissipation of the power semiconductor module 100 from an upper portion of the power semiconductor chip 6 via the capacitor 17 to the insulating substrate 4. FIG. 4, to be described next, is a diagram equivalent only to an upper arm (or a lower arm) of the power semiconductor module 100 shown in FIGS. 1A and 1B.

FIG. 4 is a diagram illustrating heat dissipation. Heat generated in the power semiconductor chip 6 is dissipated via the insulating substrate 4 to an unshown heatsink in contact with the copper plate 3 on the lower side of the insulating substrate 4, as shown by arrows 25. By installing the capacitor 17 in parallel with the power semiconductor chip 6, a kind of heat flow shown by an arrow 26 parallel to the arrows 25 occurs, and the heat is dissipated from a capacitor lower portion 17a to the insulating substrate 4. Herein, the thermal resistance Rjc is defined as the thermal resistance of a path wherein two paths are combined, a path from the upper surface of the power semiconductor chip via the solder 5 to the bottom of the copper plate 3, which is the rear surface of the insulating substrate 4, and a path from the upper surface of the power semiconductor chip via the solder 7, post electrodes 8, printed substrate 11, and capacitor 17 to the bottom of the copper plate 3 which is the rear surface of the insulating substrate 4. Also, thermal resistance Rjb is defined as the thermal resistance of a path from the upper surface of the power semiconductor chip via the solder 7, post electrodes 8, printed substrate 11, and capacitor 17 to the bottom of the copper plate 3, which is the rear surface of the insulating substrate 4. The thermal resistance Rjc becomes smaller owing to the thermal resistance of the path from the upper surface of the power semiconductor chip via the solder 7, post electrodes 8, printed substrate 11, and capacitor 17 to the bottom of the copper plate 3, which is the rear surface of the insulating substrate 4, in comparison with the thermal resistance of only the path from the upper surface of the power semiconductor chip via the solder 5 to the bottom of the copper plate 3, which is the rear surface of the insulating substrate 4.

Figure 5:
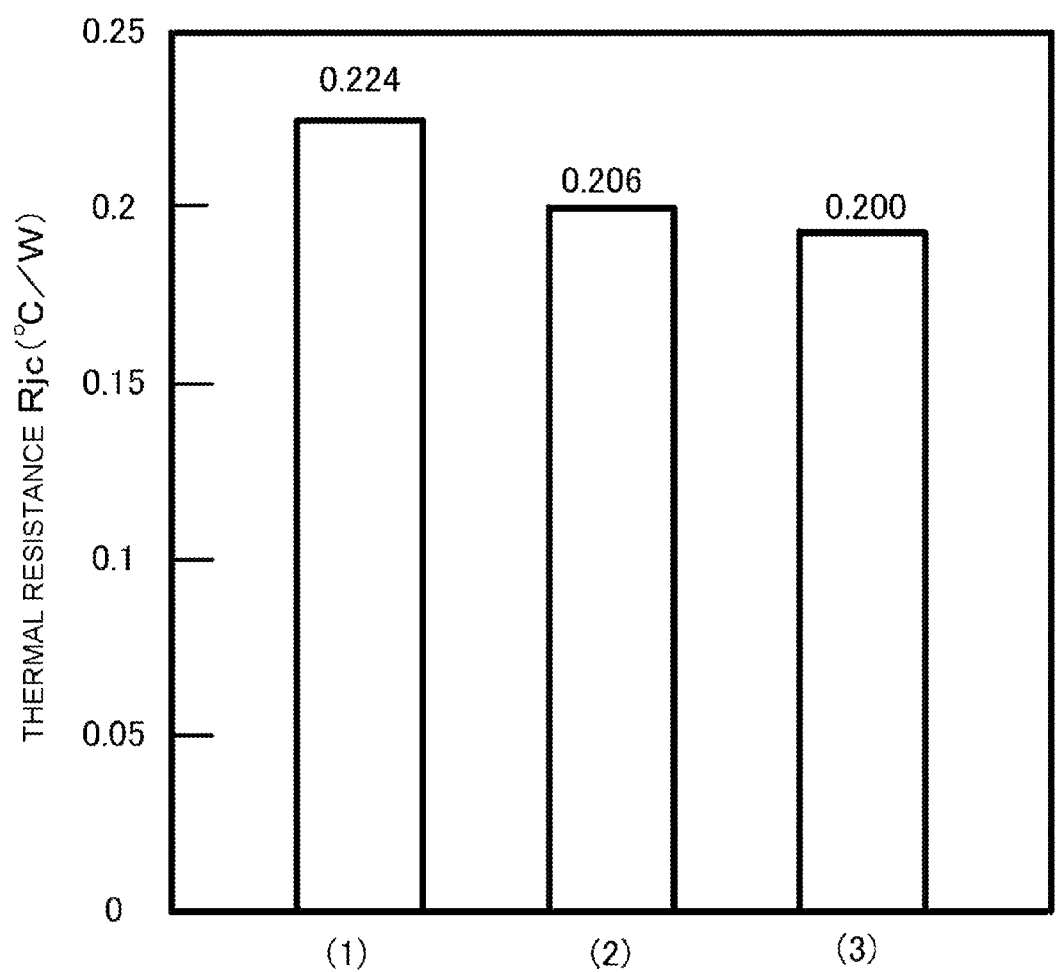
FIG. 5 is a diagram showing thermal resistance Rjc between a power semiconductor chip 6 and a copper plate 3 on the rear surface of an insulating substrate 4.

FIG. 5 is a diagram showing the thermal resistance Rjc between the power semiconductor chip 6 and the copper plate 3, which is the rear surface of the insulating substrate 4. Specifically, the thermal resistance Rjc is a value wherein the difference between the front surface temperature of the chip and the rear surface temperature of the insulating substrate 4 is divided by the amount of heat generated in the chip.

In FIG. 5, 1 is a case in which the capacitors 17 are absent in a heretofore known structure, 2 is a case in which the capacitors 17 are present in the invention, and 3 is a case in which the capacitors 17 are present, and the thickness of the copper wires 9 of the printed substrate 11 is increased. Also, there are two examples of specifications for the ceramic capacitors 18 used, an electrode area of 1.25 mm×1.6 mm, a height of 1 mm, and a capacitance of 10 pF, and an electrode area of 1.25 mm×1.6 mm, a height of 1 mm, and a capacitance of 2.2 nF.

The thermal resistance Rjc in the case of 1, in which the capacitors are absent in a heretofore known power semiconductor module 201, is 0.224° C./W. The thermal resistance Rjc in the case of 2, in which the capacitors 17 are present in the power semiconductor module 100 of the invention, is 0.206° C./W. The thermal resistance Rjb (heat transfer characteristic) in the heat dissipation path shown by the arrow 26 is 0.228° C./W. Herein, the two examples of the ceramic capacitors 18 used as the capacitors 17 have obtained the same thermal resistances Rjc and Rjb.

Also, in the case of 3 in which the thickness of the copper wire on each surface of the printed substrate 11 is increased from the previous value 0.2 mm to in the order of 3 mm in order to reduce the thermal resistance Rjc further than in the case of 2, the thermal resistance Rjc is reduced to 0.200° C./W, a reduction of in the order of 8% in comparison with in the heretofore known case. The thermal resistance Rjb at this time is 0.221° C./W. That is, by increasing the thickness of the copper wires 9, it is possible to reduce the thermal resistance Rjb by in the order of 3%.

Study results show that, as the thermal resistance Rjc reduction effect is high when the thermal resistance Rjb is approximately 0.3° C./W or less, it is desirable that the thermal resistance Rjb is 0.3° C./W or less.

Also, by increasing the thickness of the copper wires 9 further than in the case of 3, the thermal resistance Rjb decreases, and it is thus possible to further reduce the thermal resistance Rjc. According to the heretofore described working example 1, it is possible to reduce the thermal resistance Rjc from the front surface side of the chip 6 to the insulating substrate.

Working Example 2

Figure 6:
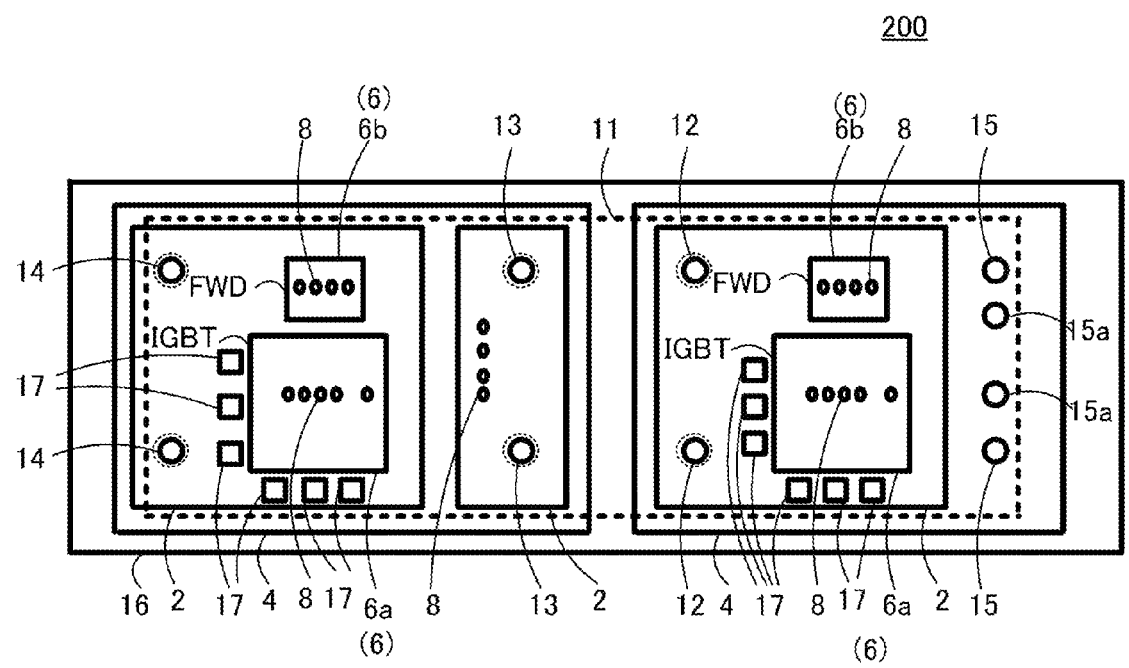
FIG. 6 is a main portion plan view of a power semiconductor module 200 of a second working example of embodiments of the invention.

FIG. 6 is a main portion plan view of a power semiconductor module 200 of a second working example of the invention. The difference from the power semiconductor module 100 of FIGS. 1A and 1B is in that a plurality of the capacitors 17 are disposed around the power semiconductor chip 6 in each combination. By disposing the plurality of capacitors 17 in this way, the capacitance thereof becomes higher, and it is thus possible to further reduce switching noise. Furthermore, as it is possible to increase the occupation area of the capacitors 17, it is possible to further reduce the thermal resistance Rjc.

Specifically, for example, by disposing six ceramic capacitors 18 with an electrode area of 0.5 mm×0.5 mm, a height of 1 mm, and a capacitance of 50 pF around the power semiconductor chip 6, it is possible to reduce switching noise by in the order of 10% in comparison with in the case of one ceramic capacitor, and at the same time, it is possible to reduce the thermal resistance Rjc to in the order of 0.195° C./W, which is at the same level as in the case of the working example 1.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-095791, filed on Apr. 19, 2012. The disclosure of the priority application, in its entirety, including the drawings, claims, and the specification thereof, is incorporated herein by reference.

What is claimed is:

1. A power semiconductor module, comprising an upper substrate and a lower
    substrate on the top of which a power semiconductor chip is mounted, wherein
    the power semiconductor chip and upper substrate are connected by conductors, and a capacitor connected in parallel circuit-wise to a power semiconductor corresponding to the power semiconductor chip connects the upper substrate and lower substrate.

2. The power semiconductor module according to claim 1, wherein
    the capacitor is formed of a plurality of capacitors connected in parallel.

3. The power semiconductor module according to claim 1, wherein
    the distance between the power semiconductor chip and capacitor is 0.3 mm or more and 10 mm or less.

4. The power semiconductor module according to claim 1, wherein
    the thermal resistance of a path from the top of the power semiconductor chip via the conductors, upper substrate, and capacitor to the bottom of the lower substrate is 0.3° C./W or less.

5. The power semiconductor module according to claim 1, wherein
    the capacitance of the capacitor is from 10 pF to 1 µF.

6. The power semiconductor module according to claim 2, wherein
    the combined capacitance of the plurality of capacitors is from 10 pF to 1 µF.

7. The power semiconductor module according to claim 1, wherein
    the upper substrate is a printed substrate, the lower substrate is a conductively patterned insulating substrate, and the conductors are post electrodes, wherein
    externally led-out terminals are connected to conductive patterns of the conductively patterned insulating substrate, a rear surface side conductive film of the conductively patterned insulating substrate and leading end portions of the externally led-out terminals are exposed, and the whole is sealed with a resin.

8. The power semiconductor module according to claim 1, wherein
    the capacitor is a ceramic capacitor chip.

* * * * *